(12) United States Patent
Groen et al.

(10) Patent No.: US 7,196,545 B1
(45) Date of Patent: Mar. 27, 2007

(54) HIGH FREQUENCY LATCH

(75) Inventors: Eric D. Groen, Ankeny, IA (US);
Charles W. Boecker, Ames, IA (US);
William C. Black, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 466 days.

(21) Appl. No.: 10/812,549

(22) Filed: Mar. 29, 2004

(51) Int. Cl.
*H03K 19/173* (2006.01)

(52) U.S. Cl. .................. 326/46; 326/82; 327/109; 327/199

(58) Field of Classification Search .............. 326/46, 326/82, 112, 115; 327/109, 111, 199, 221
See application file for complete search history.

(56) References Cited

U.S. PATENT DOCUMENTS 6,373,782 B1 * 4/2002 Ikeda .................. 365/230.08

2004/0075472 A1 * 4/2004 Jansson .................. 327/65

* cited by examiner

*Primary Examiner*—Daniel Chang
(74) *Attorney, Agent, or Firm*—James Harrison

(57) ABSTRACT

A high frequency latch comprising a latch and a plurality of buffers coupled to peak load circuitry produces a peak response at a desired frequency of operation as well as isolating each high frequency latch output of a plurality of outputs to substantially reduce the effects of a kickback signal coupled into the latch output. The peaked load circuitry comprises selectable resistive elements and selectable capacitive elements coupled as a high pass filter to change the bias on a saturation region MOSFET configured as an active load. The high pass filter produces positive feedback on the saturation region MOSFET to increase the bias at high frequencies thereby producing an increased response at a desired operating frequency.

8 Claims, 10 Drawing Sheets programmable logic device 10 programmable MGT 14 – 28 high frequency latch 70 latch with peaked load stage buffer with peaked load stage clock and data recovery module 190 differential signal with kickback peaked load stage frequency response gate-to-source capacitance peaked load method

HIGH FREQUENCY LATCH

BACKGROUND OF THE INVENTION

1. Field of the Invention

This invention relates generally to communication systems and more particularly to high frequency latch circuits used therein.

2. Description of Related Art

Communication systems are known to transport large amounts of data between a plurality of end user devices, which, for example, include telephones (i.e., land lines and cellular), facsimile machines, computers, television sets, personal digital assistants, etc. As is known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or the Internet. As is further known, communication systems include a plurality of system equipment to facilitate the transporting of data. Such system equipment includes, but is not limited to, routers, switches, bridges, gateways, protocol converters, frame relays, and private branch exchanges.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits-per-second, 100 megabits-per-second, 1 gigabit-per-second and beyond. Synchronous Optical NETwork (SONET), for example, currently provides for up to 10 gigabits-per-second. In accordance with such standards, many system components and end user devices of a communication system transport data via serial transmission paths. Internally, however, the system components and end user devices may process data in a parallel manner. As such, each system component and end user device must receive the serial data and convert the serial data into parallel data without loss of information. After processing the data, the parallel data must be converted back to serial data for transmission without loss of information.

Accurate recovery of information from high-speed serial transmissions typically requires transceiver components that operate at clock speeds equal to or higher than the received serial data rate. Higher clock speeds require oscillator circuits to have gain-bandwidth products to sustain high frequency oscillations while maintaining low phase noise. High phase noise contributes to clock jitter which degrades clock recovery in high-speed circuits. Higher clock speeds limit the usefulness of prior art clock recovery circuits that require precise alignment of signals to recover clock and/or data. Higher data rates require greater bandwidth for a feedback loop of the clock recovery circuits to operate correctly. Some prior art designs are bandwidth limited.

As the demand for data throughput increases, so do the demands on a high-speed serial transceiver. The increased throughput demands are pushing some current integrated circuit manufacturing processes to their operating limits. Integrated circuit processing limits (e.g., device parasitics, trace sizes, propagation delays, device sizes) and integrated circuit (IC) fabrication limits (e.g., IC layout, frequency response of the packaging, frequency response of bonding wires) limit the speed at which the high-speed serial transceiver may operate without excessive jitter performance or phase noise performance.

One solution for high-speed serial transceivers is to use an IC technology that inherently provides for greater speeds. For instance, switching from a Complementary Metal-Oxide Semiconductor (CMOS) process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for widespread use.

Modern communication systems, including high data rate communication systems, typically include a plurality of circuit boards that communicate with each other by way of signal traces, bundled data lines, back planes, etc. Accordingly, designers of high data rate communication transceiver devices often have conflicting design goals that relate to the performance of the particular device. For example, there are many different communication protocols specified for data rates that range from 2.48832 gigabits-per-second for OC48, to 9.95 gigabits-per-second for OC192. Other known standards define data rates of 2.5 gigabits-per-second (INFINI-BAND) or 3.125 gigabits-per-second (XAUI). For example, one protocol may specify a peak voltage range of 200–400 millivolts, while another standard specifies a mutually exclusive voltage range of 500–700 millivolts. Thus, a designer either cannot satisfy these mutually exclusive requirements (and therefore cannot support multiple protocols) or must design a high data rate transceiver device that can adapt according to the protocol being used for the communications.

Along these lines, programmable logic devices, and more particularly, field programmable gate array (FPGA) circuits are gaining in popularity for providing the required flexibility and adaptable performance, as described above, for those designers that seek to build one device that can operate according to multiple protocols. Thus, while FPGA technology affords a designer an opportunity to develop flexible and configurable hardware circuits, specific designs that achieve the desired operations must still be developed. Accordingly, there is a need for clock and data recovery circuits within a transceiver device that achieves these design objectives. Additionally, traditional clock and data recovery modules typically include latches on the input to sample and hold the incoming data. These latches tend to exhibit high frequency roll off that limits their usefulness in high data rate designs. Furthermore, at high data rates, traditional latches in data recovery circuitry produce a kickback signal that is easily coupled in to phase detection circuitry possibly causing loss of phase information and contributing to inter-symbol interference. There is a need, therefore, for a high frequency latch that overcomes these limitations.

BRIEF SUMMARY OF THE INVENTION

The present invention includes peaked load circuitry to improve the high frequency response of the high frequency latch and includes dual buffering and separate outputs for coupling to data and phase detection circuits. The dual buffering reduces kickback coupled in to the output from downstream data detection circuits.

The high frequency latch comprises a latch coupled to receive a differential input and produce a latched output therefrom. The latch includes peaked load circuitry to produce a peak response at a specified frequency of operation and to increase impedance and increase a corresponding voltage level at the specified frequency. Selectable components within the peaked load circuitry are chosen to produce the specified frequency response. A first buffer is coupled to receive the latched output and to produce therefrom a first buffered output. A second and third buffer are coupled to receive the buffered output wherein the second buffer produces a second buffered output and wherein the third buffer produces a third buffered output. The second buffered output is typically coupled to data detection circuitry of the clock and data recovery module while the third buffered output is typically coupled to a phase detection circuitry of the clock and data recovery module.

In one embodiment, the peaked load circuitry is coupled to the latch, the first and third buffers. In an alternate embodiment, the peaked load circuitry is coupled to each latch and buffer comprising the high frequency latch.

The above-referenced description of the summary of the invention captures some, but not all, of the various aspects of the present invention. The claims are directed to some of the various other embodiments of the subject matter towards which the present invention is directed. In addition, other aspects, advantages and novel features of the invention will become apparent from the following detailed description of the invention when considered in conjunction with the accompanying drawings.

DETAILED DESCRIPTION OF THE INVENTION

Figure 1:
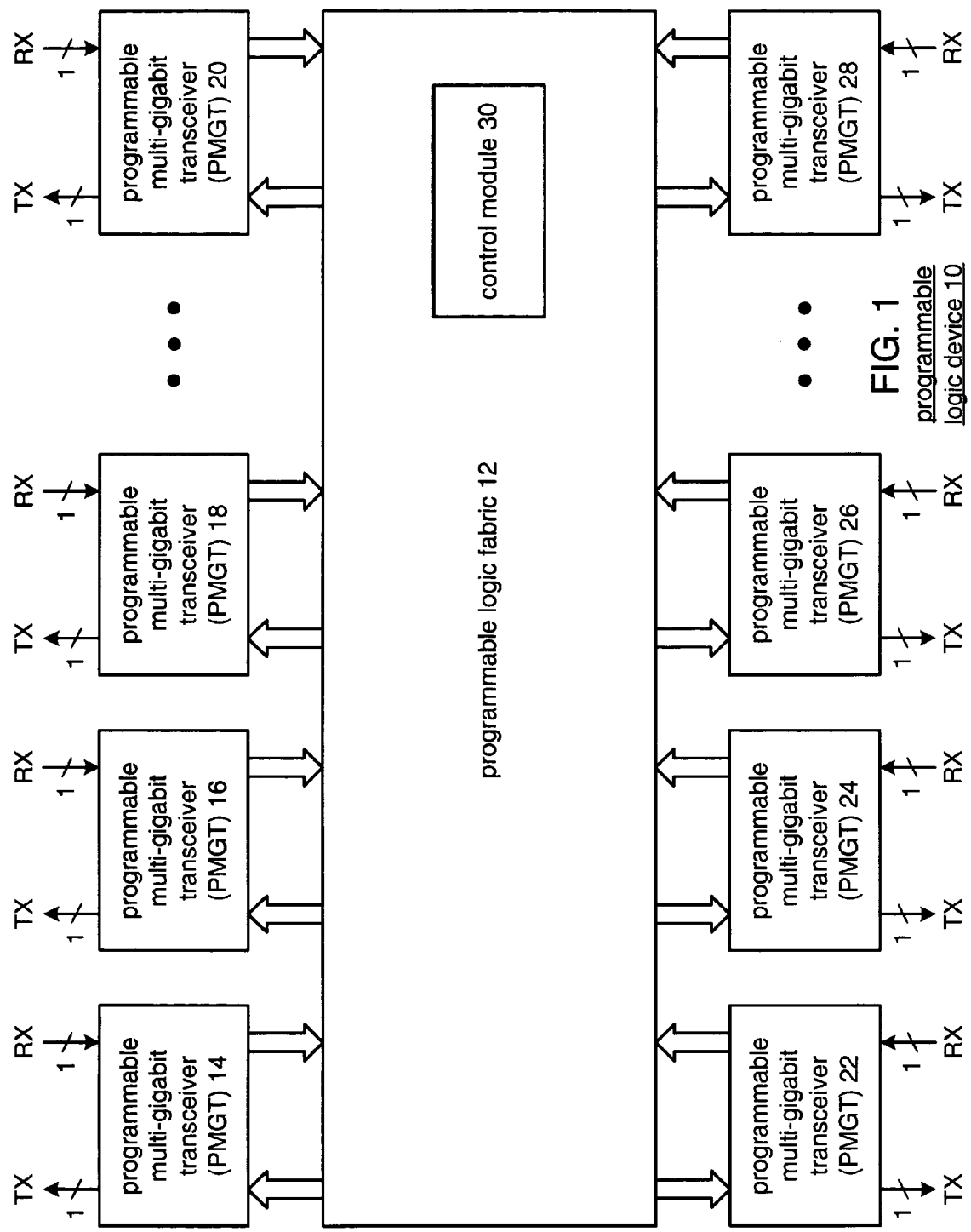
FIG. 1 is a schematic block diagram of a programmable logic device.

FIG. 1 is a schematic block diagram of a programmable logic device 10 that includes programmable logic fabric 12, a plurality of programmable multi-gigabit transceivers (PMGTs) 14–28 and a control module 30. The programmable logic device 10 may be a programmable logic array device, a programmable array logic device, an erasable programmable logic device, and/or a field programmable gate array (FPGA). When the programmable logic device 10 comprises a FPGA, the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by programmable logic device 10.

The control module 30 may be contained within the programmable logic fabric 12 or it may be a separate module. In either implementation, control module 30 generates control signals to program transmit and receive sections of each of the PMGTs 14–28. In general, each of the PMGTs 14–28 performs a serial-to-parallel conversion on receive data and performs a parallel-to-serial conversion on transmit data. The parallel data may be, for instance, 8-bits wide, 16-bits wide, 32-bits wide, or 64-bits wide.

Typically, the serial data will be a 1-bit stream of data that may be a binary level signal, a multi-level signal, etc. Further, two or more programmable multi-gigabit transceivers may be bonded together to provide greater transmitting speeds. For example, if PMGTs 14, 16 and 18 are transceiving data at 3.125 gigabits-per-second, the PMGTs 14, 16 and 18 may be bonded together such that the effective serial data rate is approximately 3 times 3.125 gigabits-per-second.

Each of the programmable multi-gigabit transceivers 14–28 may be individually programmed to conform to separate standards. In addition, the transmit path and receive path of each programmable multi-gigabit transceiver 14–28 may be separately programmed such that the transmit path of a transceiver is supporting one standard while the receive path of the same transceiver is supporting a different standard. Further, the serial data rates of the transmit path and receive path may be programmed, for example, from 1 gigabit-per-second to tens of gigabits-per-second. The size of the parallel data in the transmit and receive sections, or paths, is also programmable and may vary, for instance, from 8-bits, 16-bits, 32-bits, or 64-bits.

Figure 2:
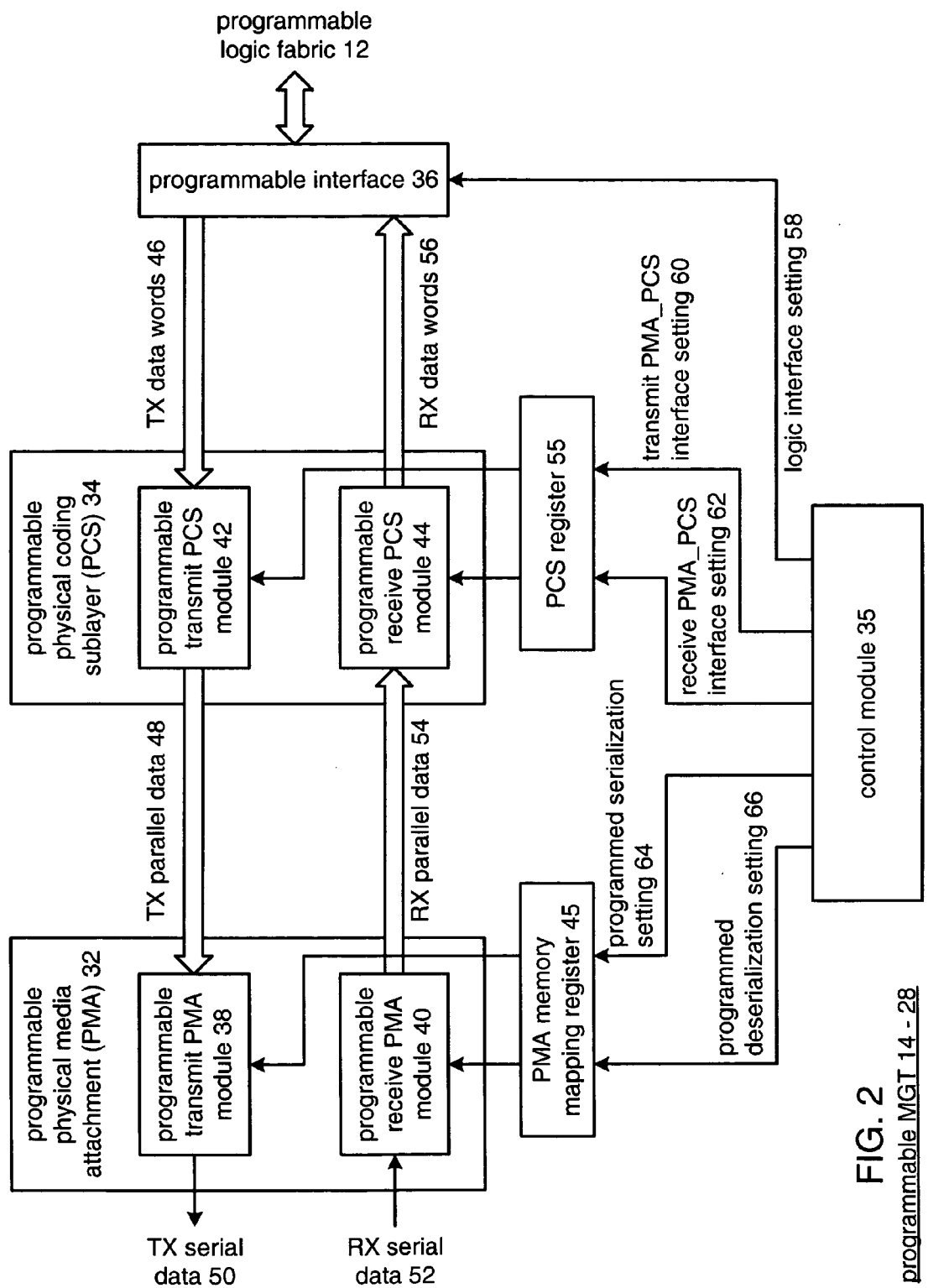
FIG. 2 is a schematic block diagram of one embodiment of a representative one of the programmable multi-gigabit transceivers.

FIG. 2 is a schematic block diagram of one embodiment of a representative one of the programmable multi-gigabit transceivers 14–28. As shown, the programmable multi-gigabit transceiver 14–28 includes a programmable physical media attachment (PMA) module 32, a programmable physical coding sublayer (PCS) module 34, a programmable interface 36, a control module 35, a PMA memory mapping register 45 and a PCS register 55. The control module 35, based on the desired mode of operation for the individual programmable multi-gigabit transceiver 14–28, generates a programmed deserialization setting 66, a programmed serialization setting 64, a receive PMA_PCS interface setting 62, a transmit PMA_PCS interface setting 60, and a logic interface setting 58. The control module 35 may be a separate device within each of the programmable multi-gigabit transceivers or included partially or entirely within the control module 30 of FIG. 1.

In either embodiment of the control module 35, the programmable logic device control module 30 determines the corresponding overall desired operating conditions for the programmable logic device 10 and provides the corresponding operating parameters for a given programmable multi-gigabit transceiver to its control module 35, which generates the settings 58–66.

The programmable PMA module 32 includes a programmable transmit PMA module 38 and a programmable receive PMA module 40. The programmable transmit PMA module 38 is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapping register 45 may store the programmed serialization setting 64 and the programmed deserialization setting 66.

The programmable PCS module 34 includes a programmable transmit PCS module 42 and a programmable receive PCS module 44. The programmable transmit PCS module 42 receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., one byte, two bytes, three bytes, four bytes) and the corresponding transmission rate of the transmit parallel data 48. The programmable receive PCS module 44 converts the receive parallel data 54 into receive data words 56 in accordance with the receive PMA_PCS interface setting 62. The receive PMA_PCS interface setting 62 indicates the rate at which the receive parallel data 54 will be received, the width of the receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the receive data words 56 are provided to the programmable logic fabric 12.

As one of average skill in the art will appreciate, each of the modules within the programmable PMA module 32 and programmable PCS module 34 may be individually programmed to support a desired data transfer rate. The data transfer rate may be in accordance with a particular standard such that the receive path, i.e., the path through programmable receive PMA module 40 and the programmable receive PCS module 44 may be programmed in accordance with one standard, while the transmit path, i.e., the path through the programmable transmit PCS module 42 and the programmable transmit PMA module 38, may be programmed in accordance with the same or another standard.

Figure 3:
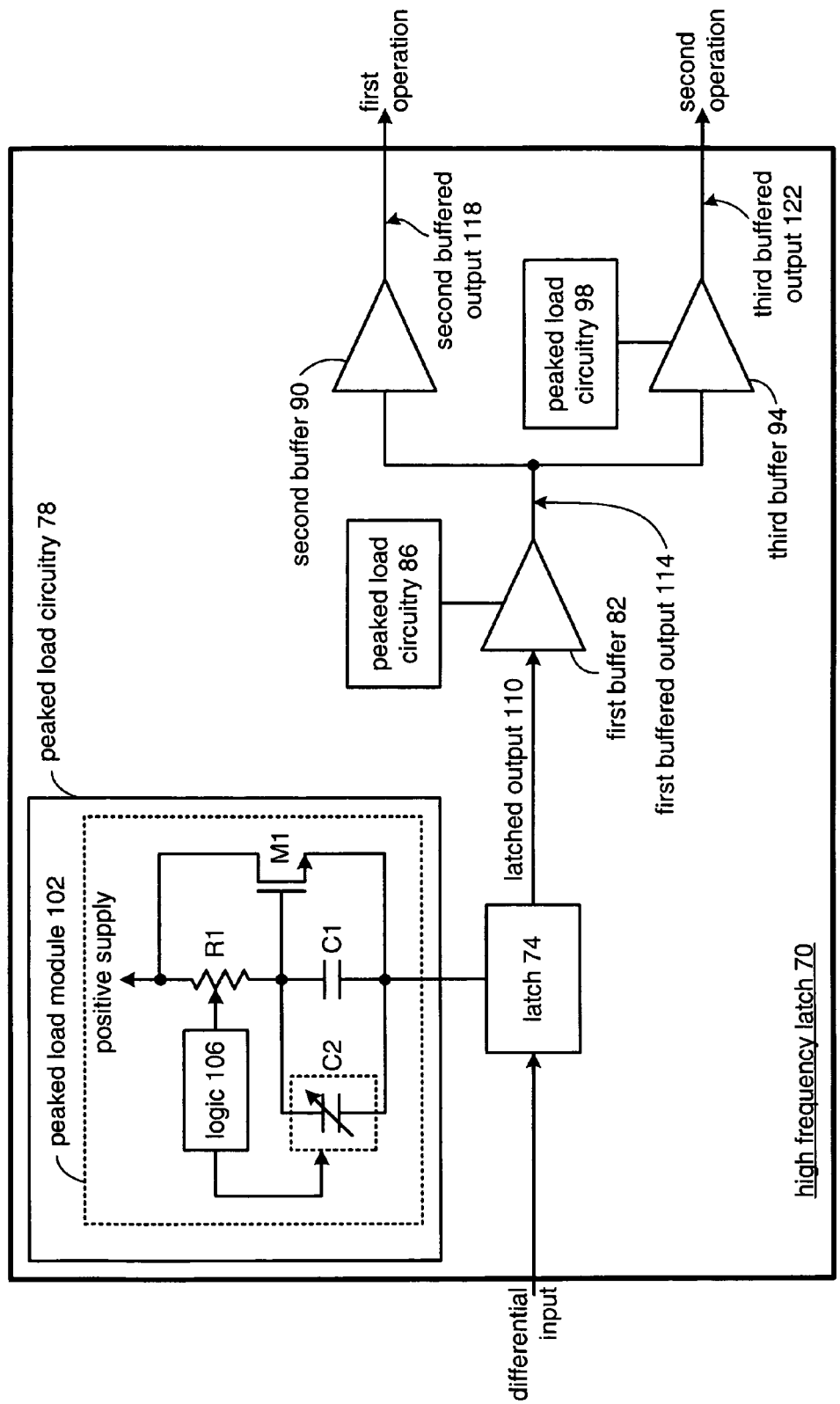
FIG. 3 is a high frequency latch according to one embodiment of the present invention.

FIG. 3 is a high frequency latch according to one embodiment of the present invention. High frequency latch 70 comprises latch 74, peaked load circuitry 78, first buffer 82, peaked load circuitry 86, second buffer 90, third buffer 94 and peaked load circuitry 98. The peaked load circuitry, namely peaked load circuitry 78, peaked load circuitry 86, and peaked load circuitry 98, increase an output signal magnitude, of the coupled device, at the desired frequency of operation to compensate for high frequency losses. It should be understood that, for clarity, FIG. 3 is shown as a single ended device, but is differential in the present embodiment of the invention. Alternate embodiments, however, may operate as single ended devices.

Each peaked load circuitry comprises at least one peaked load module operably coupled to an output of the corresponding device. Differential circuits, of course, require two peaked load modules. Peaked load circuitry 78 includes peaked load module 102 further including an N-type MOSFET M1 biased in the saturation region, a MOSFET configured capacitor C1, selectable capacitive load C2, selectable resistive load R1, and logic 106.

Operating under one of manual or automatic control, logic 106 adjusts the resistance of selectable resistive load R1 and the capacitance of selectable capacitive load C2 to adjust the output signal magnitude at the desired frequency of operation. Selectable resistive load R1, coupled between a positive supply ($V_{DD}$) and a gate of MOSFET M1, controls the steady state or DC bias on MOSFET M1 and, consequently, the saturation region resistance of MOSFET M1. MOSFET configured capacitor C1 is coupled in parallel with selectable capacitive load C2 and an internal gate-to-source capacitance of MOSFET M1. The parallel coupled capacitors C1 and C2 are coupled to selectable resistive load R1 to form a high pass filter that produces positive feedback from latched output 110 to the gate of MOSFET M1. The positive feedback increases the bias on the gate of MOSFET M1 thereby increasing the source-to-drain resistance at the desired frequency of operation which increases the output signal magnitude of latched output 110.

Latched output 110 produced from latch 74 is operably coupled to first buffer 82. Peaked load circuitry 86, operably coupled to first buffer 82, is similar to peaked load circuitry 78 and increases the output signal magnitude of first buffered output 114. First buffered output 114 is produced to second buffer 90 that produces a second buffered output 118 to a first operation external to high frequency latch 70. A typical example of the first operation is the data detection circuitry used in the clock and/or data recovery module. The data detection circuitry typically includes a latch directly coupled to an input node that creates kickback when the latch changes from track to latch.

Kickback, as is known to one of average skill in the art, is a discontinuity created in a signal coupled from an external output node to a latch input node caused by excess charge transfer in or out of the input node of a latch when the latch switches from track to latch. A small parasitic capacitance coupled between the latch input node and the external output node charges to the voltage on the input node. When the latch switches from track (sample) to latch (hold), the voltage coupled on the input node rapidly changes from a first logic level (logic one, for example) to a second logic level (logic zero, for example). This rapid change is a very small delta-t in the charge equation I=C*delta-v/delta-t. The change from the first logic level to the second logic level represents a substantial delta-v thereby generating a charge current that is discharged creating the kickback.

First buffered output 114 is also coupled to third buffer 94. Third buffer 94 is operably coupled to peaked load circuitry 98 that is functionally identical to peaked load circuitry 78. Third buffer 94 produces a third buffered output 122 to a second operation external to high frequency latch 70. A typical example of the second operation is phase detection circuitry used in the clock and/or data module. In a 10 GHz bandwidth, the phase detection circuit has to detect a 50 picosecond pulse to accurately recover the clock. The 50 picosecond pulse requirement makes the phase detection circuit very sensitive to noise, such as kickback from the data detection circuit.

One aspect of the present invention is to use double buffering to isolate the phase detection circuitry from the kickback produced by the data detection circuitry. Second buffer 90 and third buffer 94 perform this double buffering function. Second buffer 90 has a low output impedance to absorb the kickback that, in some prior art designs, would otherwise be coupled directly to the phase detection circuitry. Third buffer 94 provides further isolation between second buffered output 118 and third buffered output 122.

Figure 4:
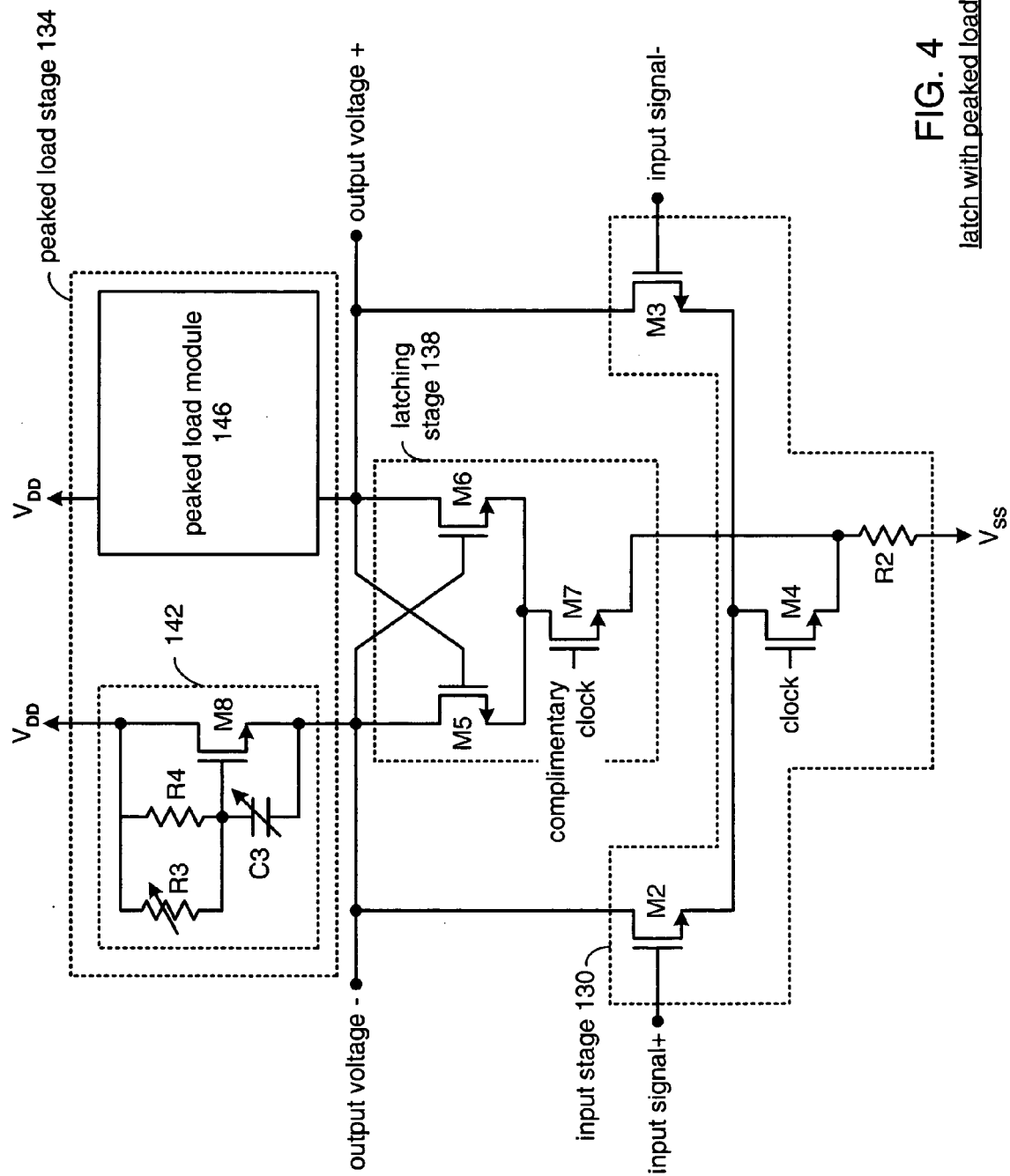
FIG. 4 is a schematic block diagram of a latch with a peaked load stage according to one embodiment of the present invention.

FIG. 4 is a schematic block diagram of a latch with a peaked load stage according to one embodiment of the present invention. The latch comprises an input stage 130, a peaked load stage 134, and a latching stage 138. Input stage 130 comprises a differential pair of MOSFETs, M2 and M3, having commonly coupled sources further coupled to a drain of input stage biasing MOSFET M4. Biasing MOSFET M4 is coupled to receive a clock as a bias signal wherein the clock biases MOSFET M4 ON during a positive transition of the clock. A source of biasing MOSFET M4 is coupled to an input stage biasing resistor R2 that is further coupled to a negative supply ($V_{SS}$). When biased ON by biasing MOSFET M4, differential MOSFET pair M2 and M3 produce differential currents to peaked load stage 134.

Peaked load stage 134 receives the differential currents and produces therefrom differential output voltages (output voltage+ and output voltage−) of a desired output signal magnitude for a desired frequency of operation. Peaked load stage 134 comprises peaked load modules 142 and 146. Peaked load module 142 comprises MOSFET M8, selectable capacitor C3, selectable resistor R3, and resistive element R4. A drain of MOSFET M8 is coupled to a positive supply ($V_{DD}$), and a source of MOSFET M8 is coupled to a drain of MOSFET M2 of input stage 130. Selectable capacitor C3 is coupled between a gate of MOSFET M8 and the source of MOSFET M8. Selectable resistor R3 and resistive element R4 are coupled in parallel between the positive supply ($V_{DD}$) and the gate of MOSFET M8. Although not shown, a gate-to-source capacitance, Cgs, internal to MOSFET M8 is effectively coupled in parallel with selectable capacitor C3. The parallel coupled capacitors C3 and Cgs, and the parallel coupled resistors R3 and R4, create a high pass filter that produces the peaked response at the desired frequency of operation.

The parallel coupled resistors R3 and R4 set the steady state bias or DC bias of MOSFET M8 to operate in the saturation region. The output voltage− is coupled, as positive feedback, to the gate of MOSFET M8 by the parallel coupled capacitors C3 and Cgs. The positive feedback increases the bias on MOSFET M8 as a function of frequency, thereby increasing the saturation region resistance of MOSFET M8 and increasing the output voltage− magnitude as a function of frequency. Peaked load module 146 is functionally identical to peaked load module 142 and produces output voltage+ from the differential current received from MOSFET M3 of input stage 130.

The latch of FIG. 4 includes latching stage 138 to create a track and latch (also known as a sample and hold) function as is known to one of average skill in the art. As the name implies, the differential output voltage will track the differential input signal during a positive transition of the clock signal. During a positive transition of a complementary clock signal, the differential output voltage is latched (held constant) regardless of changes in the differential input signal. To accomplish this, latching stage 138 comprises a first MOSFET M5, a second MOSFET M6, and a biasing MOSFET M7. First and second MOSFETs M5 and M6, respectively, have commonly coupled sources connected to a drain of biasing MOSFET M7. A source of biasing MOSFET M7 is coupled to input stage biasing resistor R2. A drain of first MOSFET M5 is coupled to peaked load module 142 and is further coupled to a gate of second MOSFET M6. Similarly, a drain of second MOSFET M6 is coupled to peaked load module 146 and also coupled to a gate of first MOSFET M5.

As can be seen in FIG. 4, first MOSFET M5 and second MOSFET M6 have cross-connected gates. When first MOSFET M5 and second MOSFET M6 are biased ON by the complementary clock coupled to a gate of biasing MOSFET M7, the differential output voltages coupled to the gates of first MOSFET M5 and second MOSFET M6 biases them so they maintain the output voltage. For example, assume output voltage+ on the drain of second MOSFET M6 is positive and output voltage− on the drain of first MOSFET M5 is negative. The positive output voltage+ on the drain of second MOSFET M6 is also coupled to the gate of first MOSFET M5 biasing it ON. First MOSFET M5 produces current to peaked load module 142 thereby holding or latching the negative output voltage−. The negative output voltage− is also coupled to the gate of second MOSFET M6 which turns it OFF. When second MOSFET M6 is biased OFF by the negative output voltage− coupled to the gate of second MOSFET M6, second MOSFET M6 does not produce current to peaked load module 146 thereby latching or holding the positive output voltage+ constant.

The selectable capacitors, selectable resistors and, to some extent, the Cgs of the MOSFETs of peaked load modules 146 and 142 have values selected to achieve an increased output signal magnitude at the desired frequency of operation. The values may be set by one of manual or automatic control or may be selected during testing to meet a specific design goal.

Figure 5:
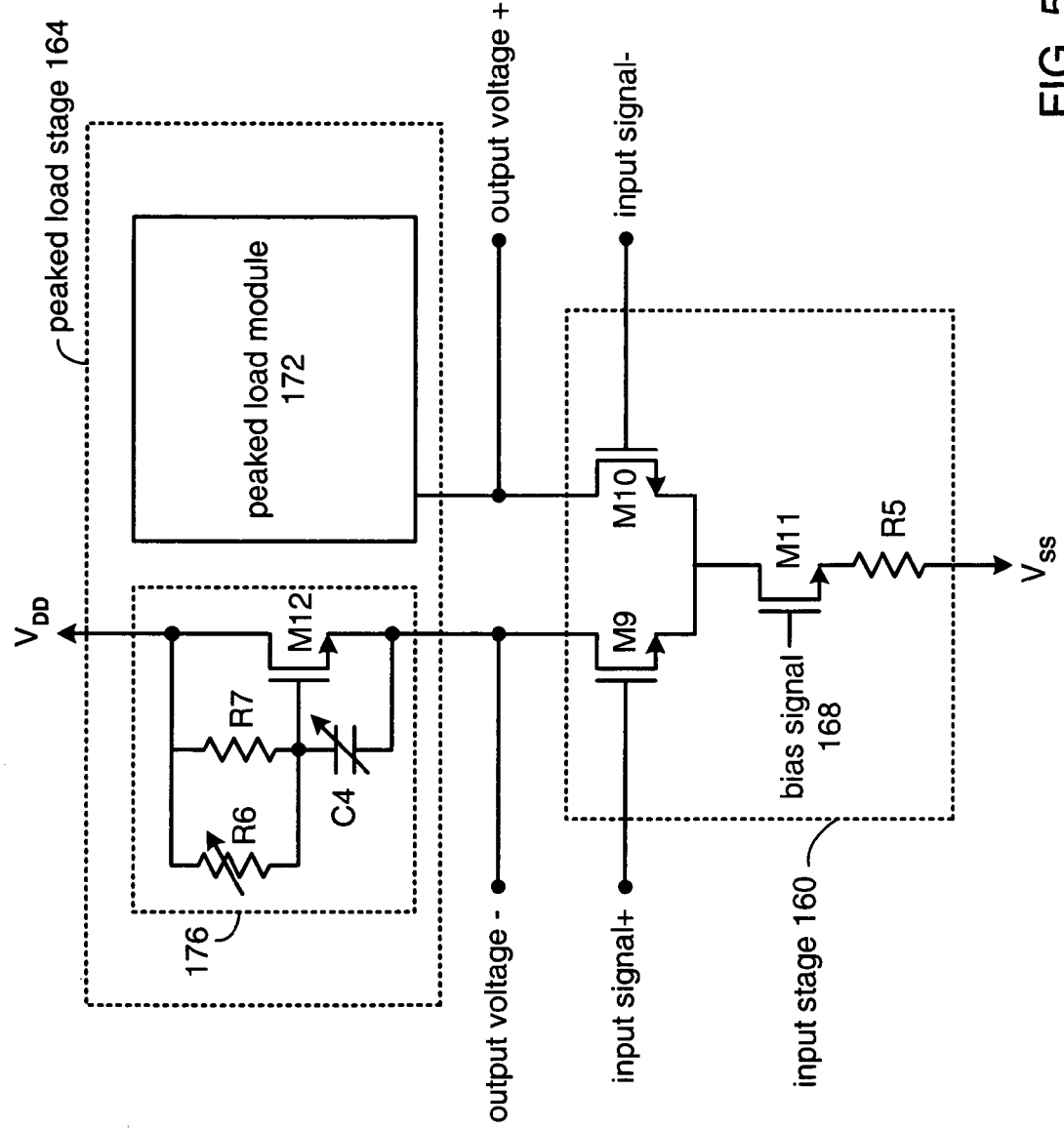
FIG. 5 is a schematic block diagram of a buffer with a peaked load stage according to one embodiment of the present invention.

FIG. 5 is a schematic block diagram of a buffer with a peaked load stage according to one embodiment of the present invention. The buffer produces an increased output signal magnitude for a desired frequency of operation to downstream elements such as phase detection circuitry in clock and data recovery modules. The increased signal magnitude compensates for circuit losses due to upstream elements. The buffer comprises an input stage 160 and a peaked load stage 164. Input stage 160 comprises a differential pair of MOSFETs, M9 and M10, having commonly coupled sources further coupled to a drain of biasing MOSFET M11. Biasing MOSFET M11 is coupled to receive a bias signal 168 that biases MOSFET M11 in the saturation region. A source of biasing MOSFET M11 is coupled to a biasing resistor R5 that is further coupled to a negative supply ($v_{SS}$). Biasing MOSFET M11 and biasing resistor R5 bias differential MOSFET pair M9 and M10 in the saturation region to produce amplified differential currents to peaked load stage 164 thereby producing the differential output voltage (output voltage+ and output voltage−). The gain provided by the transconductance of input stage 160 and the peaking function of peaked load stage 164 achieves the desired output signal magnitude.

Peaked load stage 164 receives the differential currents from input stage 160 and produces therefrom output voltage+ and output voltage− of the desired output signal magnitude for the desired frequency of operation. Peaked load stage 164 comprises peaked load modules 172 and 176. Peaked load module 176 comprises MOSFET M12, selectable capacitor C4, selectable resistor R6, and resistive element R7. A drain of MOSFET M12 is coupled to a positive supply ($V_{DD}$) and a source of MOSFET M12 is coupled to a drain of MOSFET M9 of input stage 160. Selectable capacitor C4 is coupled between a gate of MOSFET M12 and the source of MOSFET M12. Selectable resistor R6 and resistive element R7 are coupled in parallel between the positive supply ($V_{DD}$) and the gate of MOSFET M12. Although not shown, a gate-to-source capacitance, Cgs, internal to MOSFET M12 is effectively coupled in parallel with selectable capacitor C4. The parallel coupled capacitors C4 and Cgs and the parallel coupled resistors R6 and R7 create a high pass filter that produces the peaked response at the desired frequency of operation.

The parallel coupled resistors R6 and R7 set the steady state bias or DC bias of MOSFET M12 to operate in the saturation region. The output voltage– is coupled, as positive feedback, to the gate of MOSFET M12 by the parallel coupled capacitors C4 and Cgs. The positive feedback increases the bias on MOSFET M12 as a function of frequency, thereby increasing the saturation region resistance of MOSFET M12 and increasing the output voltage– magnitude as a function of frequency. Peaked load module 172 is functionally identical to peaked load module 176 and produces output voltage+ from the differential current received from MOSFET M10 of input stage 160.

The selectable capacitors, selectable resistors and, to some extent, the Cgs of the MOSFETs of peaked load modules 172 and 176 have values selected to achieve the increased output signal magnitude at the desired frequency of operation. The values may be set by one of manual or automatic control or may be selected during testing to meet a specific design goal.

Figure 6:
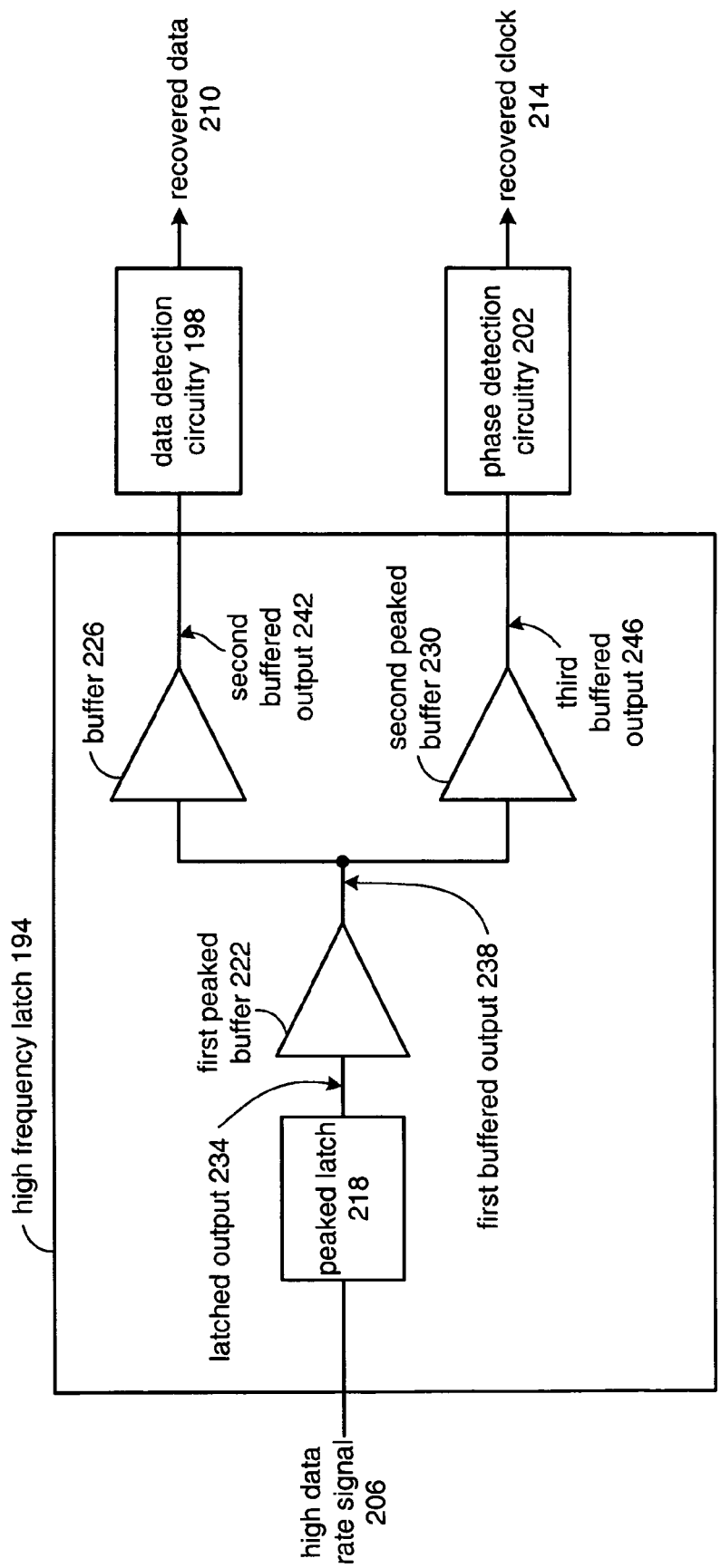
FIG. 6 is schematic block diagram of a clock and data recovery module.

FIG. 6 is a schematic block diagram of a clock and data recovery module. Clock and data recovery module 190 comprises a high frequency latch 194, data detection circuitry 198, and phase detection circuitry 202. Clock and data recovery module 190 receives a high data rate signal 206 from an upstream component such as an analog front end of a high data rate receiver or the programmable receive PMA module 40 of FIG. 2, amplifies and buffers the signal and produces the amplified and buffered signal to data detection circuitry 198 and phase detection circuitry 202 to produce a recovered data signal 210 and recovered clock signal 214, respectively.

High frequency latch 194 comprises a peaked latch 218, a first peaked buffer 222, a buffer 226, and a second peaked buffer 230. Peaked latch 218 receives and amplifies high data rate signal 206 and produces therefrom latched output 234. Peaked latch 218 operates to track and latch a value of the received high data rate signal 206. Peaked latch 218 comprises a latch with a peaked load stage and operates as was described with respect to FIG. 4.

First peaked buffer 222 receives latched output 234, provides amplification and buffering to produce first buffered output 238. First buffered output 238 is coupled to buffer 226 and to second peaked buffer 230. Buffer 226 produces second buffered output 242 to data detection circuitry 198 and buffers the kickback produced from data detection circuitry 198. One aspect of the present invention is to provide double buffering between data detection circuitry and phase detection circuitry in the clock and data recovery module to reduce errors caused by kickback produced by latching action in the data detection circuitry. Kickback will be discussed with respect to FIG. 7. Second peaked buffer 230 receives first buffered output 238 and provides the peaked output signal magnitude at the desired frequency of operation as third buffered output 246. Phase detection circuitry 202 receives third buffered output 246 and recovers a clock therefrom. Second peaked buffer 230 comprises a buffer with a peaked load stage and operates as was described with respect to FIG. 5.

Figure 7:
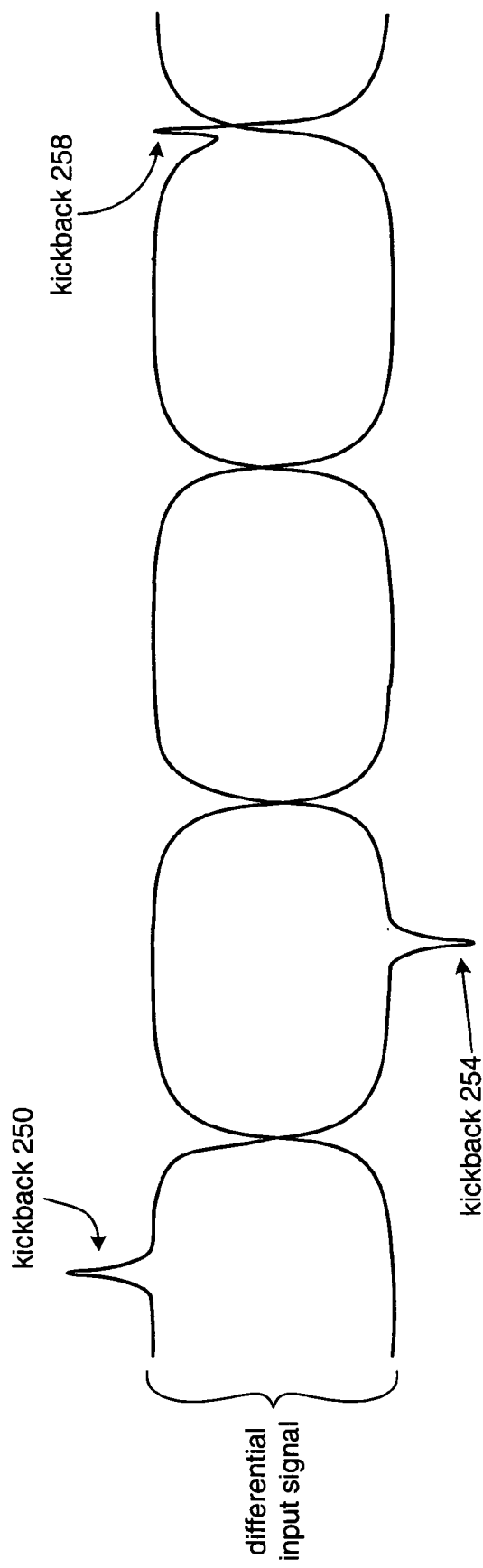
FIG. 7 illustrates a differential signal with kick back.

FIG. 7 illustrates a differential signal with kickback. As was previously discussed with respect to FIG. 3, kickback is a discontinuity in the differential signal (or any signal) caused by excess charge transfer in or out of an input node of a latch when the latch changes states from track to latch. A small parasitic capacitance coupled between the input node and an output node charges to the voltage on the input node. When the latch changes from track to latch, the voltage coupled to the input node changes rapidly from a first logic level (logic one, for example) to a second logic level (logic zero, for example). This rapid change is a very small delta-t in the charge equation I=C*delta-v/delta-t. The change from the first logic level to the second logic level represents a substantial delta-v thereby generating a charge current that, when discharged, creates the kickback waveforms as illustrated by FIG. 7.

The track and latch action is typically triggered by a clock when sampling the input differential signal for clock and data recovery modules. Consequently, the kickback signal can disturb the data and/or the phase information if the kickback signal is coincident with the sample. For example, kickback signals 250 and 254 in FIG. 7 are approximately centered in a bit period of the differential signal. Clock and data recovery modules typically try to sample in the center of the bit period so the kickback signal would cause a bit error in the recovered data.

Phase information is typically sampled during a zero crossing of the differential input signal to recover a clock signal. Kickback signal 258 of FIG. 7 occurs at the zero crossing of the differential signal generating an erroneous phase sample. In some clock and data recovery modules, this erroneous phase sample causes a voltage controlled oscillator to erroneously change frequency and thus lose lock. As mentioned previously, one aspect of the present invention is to buffer the data detection circuits from the phase detection circuits to substantially eliminate the kickback signal.

Figure 8:
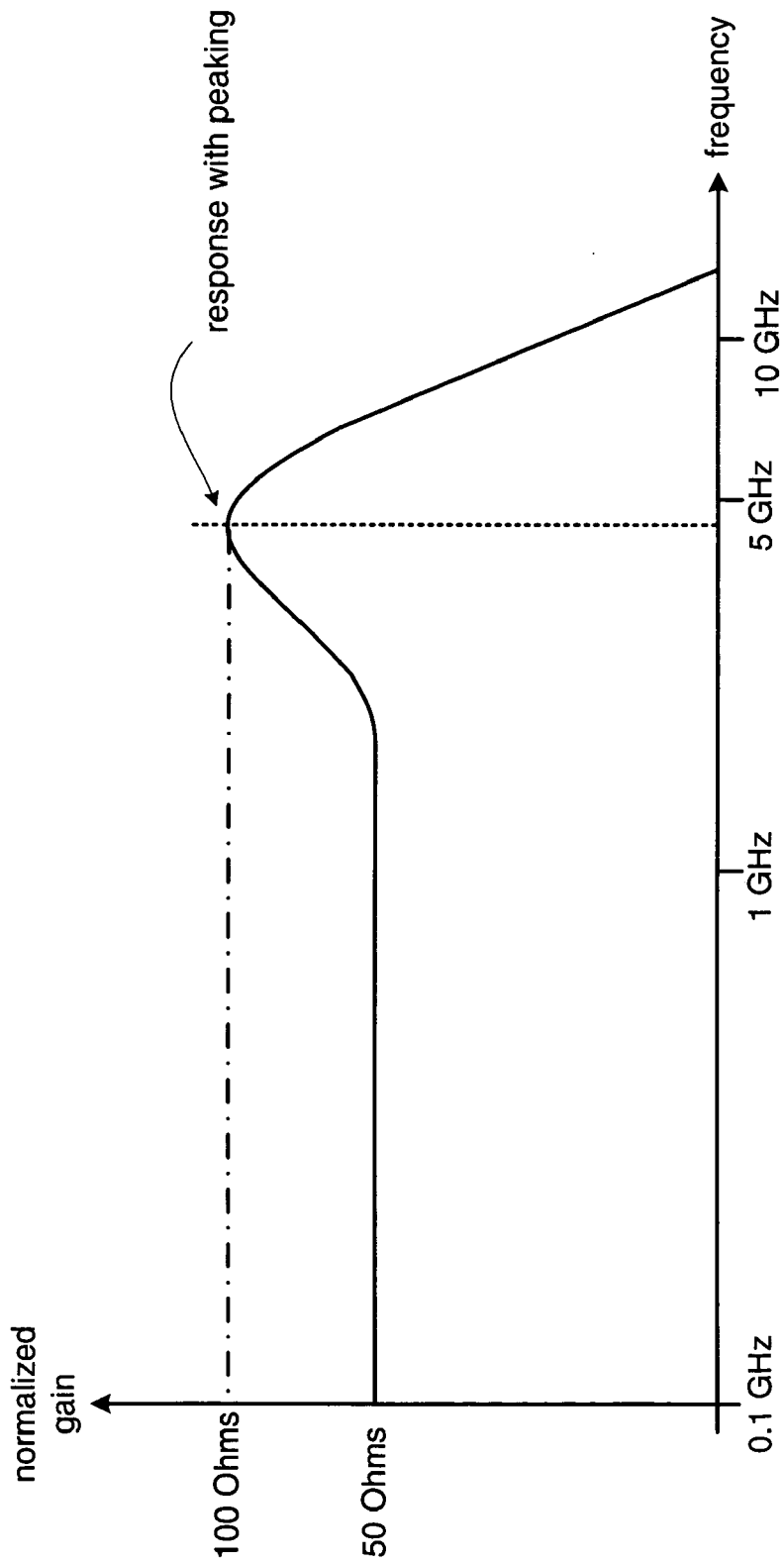
FIG. 8 is a graph of a peaked load stage frequency response according to one embodiment of the present invention.

FIG. 8 is a graph of a peaked load stage frequency response according to one embodiment of the present invention. As was previously discussed, one aspect of the present invention is to increase the signal level at a desired frequency of operation to compensate for circuit losses. The peaked load stage in the latch and buffers provides the required gain at the desired frequency.

As can be seen, the output signal magnitude peaks at a desired frequency of operation determined by the positive feedback produced by the high pass filter formed the parallel coupled capacitors and the parallel coupled resistors. In one embodiment, the peaked load stage is configured to have an impedance of 50 ohms at low frequency that increases to 100 ohms at the desired frequency. As can further be seen in FIG. 8, the peak response is between 4 GHz and 5 GHz. The magnitude of the response curve rolls off at higher frequencies due to the decreasing impedance of the peaked load stage capacitance. One of average skill in the art will recognize that the graph of FIG. 8 is exemplary and further represents an ideal frequency response with no ripple in the pass band and a smooth roll off from the peak with no ringing.

Figure 9:
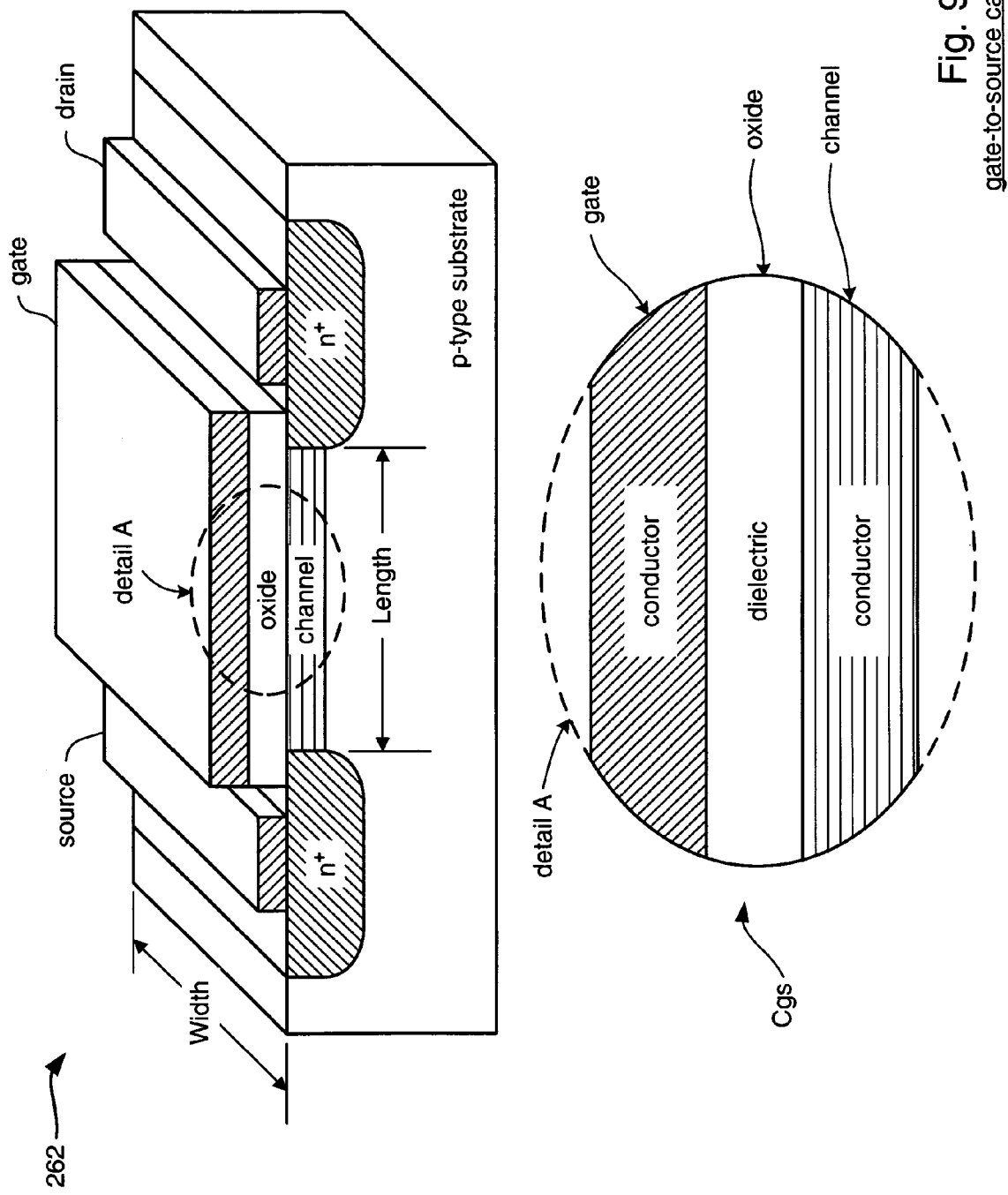
FIG. 9 is a schematic block diagram illustrating gate-to-source capacitance in an N-channel MOSFET.

FIG. 9 is a schematic block diagram illustrating gate-to-source capacitance in an N-channel MOSFET. A capacitor is formed when two parallel plate conductors separated by an insulator are charged with a voltage potential. The capacitance is directly proportional to the area of the parallel plates and inversely proportional to the distance separating the parallel plates. As shown generally at 262, the NMOS channel MOSFET is formed by depositing two heavily doped n-type (n+) regions on a p-type substrate. An insulating oxide layer is deposited on the p-type substrate connecting the two n+ regions. A conducting material is deposited on the oxide layer to create the gate. The source and drain are created by depositing a conductive material over the two n+ regions.

When a positive voltage is applied to the gate, a conductive channel is formed in the p-type substrate beneath the oxide layer thereby creating a conduction channel between the drain and source. As can be seen in detail A of FIG. 9, this creates a pair of parallel conductors (gate and channel) separated by an insulator (dielectric) (oxide layer), i.e., a capacitor. The capacitance of the gate-to-source capacitor is directly proportional to the width and length of the channel and inversely proportional to the oxide layer thickness. In one embodiment of the invention, the width of the channel is formed to be 100 microns, while the length of the channel is formed to be 0.3 microns so as to yield a more predictable capacitive value than is provided by the minimum capacitive value of typical IC processes.

When MOSFET 262 is biased in the triode region, the channel is substantially of uniform depth from drain-to-source, thus forming a gate-to-source capacitance and a gate-to-drain capacitance. The MOSFET of an embodiment of the present invention is biased in the saturation region. As is known to one of average skill in the art, the saturation region channel is tapered from drain to source with the drain end of the channel substantially pinched off. Therefore, the capacitance formed by the gate and channel is almost entirely due to the gate-to-source capacitance.

Figure 10:
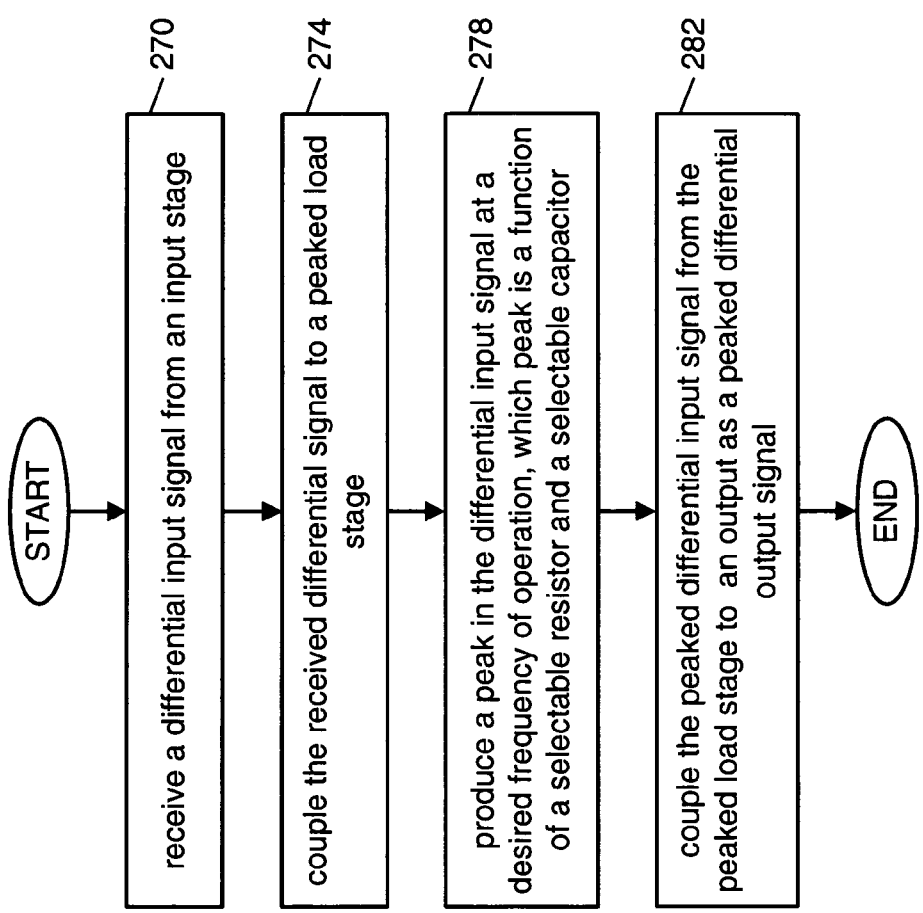
FIG. 10 is a flowchart of a method for producing a peaking function for high data rate input signals.

FIG. 10 is a flowchart of a method for producing a peaking function for high data rate input signals. The peaked load stage receives a differential input signal from an input stage (step 270) to increase an output signal magnitude at the desired frequency of operation. The received differential input signal is coupled to a peaked load stage (step 274) comprising a MOSFET configured capacitor, a resistive element, a selectable capacitor, a selectable resistor, and a MOSFET. The selectable resistor comprises one of a saturation region MOSFET, a poly-silicon resistive element and a discrete resistive element as is known to one of average skill in the art. As is further known to one of average skill in the art, the selectable capacitor comprises one of a MOSFET configured capacitor and a discrete capacitive element. The selectable capacitor and selectable resistor are configured as a high pass filter to produce a peak in the differential input signal at the desired frequency of operation, wherein the peak is a function of the selectable resistor and the selectable capacitor (step 278). The peaked differential input signal is coupled from the peaked load stage to an output as a peaked differential output signal (step 282). As was previously discussed, the peaked differential output signal is selected to have the peak response at the desired frequency of operation in the high data rate circuits.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the sprit and scope of the present invention as defined by the claims.

What is claimed is:

1. Latch circuitry for high frequency operations, comprising:
   a latch coupled to receive a differential input, the latch producing a latched output;
   first buffer coupled to receive the latched output, the first buffer producing a first buffered output;
   second and third buffers coupled to receive the first buffered output wherein the second buffer produces a second buffered output for a first operation and wherein the third buffer produces a third buffered output for a second operation; and
   peaked load circuitry coupled to at least one of the latch, the first, second and third buffers for producing a peaked response at a specified frequency of operation, the peaked load circuitry for increasing impedance and a corresponding voltage level at the specified frequency to at least one of the latch, first and third buffers, respectively.

2. The latch circuitry of claim 1 wherein peaked load circuitry includes a peaked load module that is coupled to each of the latch, the first and third buffers.

3. The latch circuitry of claim 2 wherein each peaked load module comprises a resistive element coupled across a gate and one of a source or drain of a field effect transistor.

4. The latch circuitry of claim 3 wherein each peaked load module comprises a resistive element coupled across a gate and a drain of a n-type MOSFET.

5. The latch circuitry of claim 4 wherein the resistive element further comprises a selectable resistive load coupled to logic for setting a desired frequency of operation for an increased output signal magnitude.

6. The latch circuitry of claim 3 wherein each peaked load module comprises a MOSFET configured capacitor and further wherein a selectable capacitive load is coupled to logic for setting a desired frequency of operation for the increased output signal magnitude and is further coupled in parallel with the MOSFET configured capacitor of the peaked load module.

7. The latch circuitry of claim 1 wherein the peaked load circuitry is coupled to the latch and to the first and third buffers only.

8. The latch circuitry of claim 1 wherein the second buffer isolates the first operation from the second operation by discharging a kickback signal produced by the first operation.

* * * * *